US010950456B2

United States Patent
Chou et al.

(10) Patent No.: US 10,950,456 B2
(45) Date of Patent: *Mar. 16, 2021

(54) HIGH-DENSITY SEMICONDUCTOR DEVICE

(71) Applicant: Taiwan Semiconductor Manufacturing Company Limited, Hsinchu (TW)

(72) Inventors: Lei-Chun Chou, Taipei (TW); Chih-Liang Chen, Hsinchu (TW); Chih-Ming Lai, Hsinchu (TW); Charles Chew-Yuen Young, Cupertino, CA (US); Chin-Yuan Tseng, Hsinchu (TW); Hsin-Chih Chen, New Taipei (TW); Shi Ning Ju, Hsinchu (TW); Jiann-Tyng Tzeng, Hsinchu (TW); Kam-Tou Sio, Hsinchu County (TW); Ru-Gun Liu, Hsinchu County (TW); Wei-Cheng Lin, Taichung (TW); Wei-Liang Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/600,630

(22) Filed: Oct. 14, 2019

(65) Prior Publication Data
US 2020/0043741 A1 Feb. 6, 2020

Related U.S. Application Data

(63) Continuation of application No. 15/585,289, filed on May 3, 2017, now Pat. No. 10,446,406.
(Continued)

(51) Int. Cl.
*H01L 21/308* (2006.01)
*H01L 21/306* (2006.01)
(Continued)

(52) U.S. Cl.
CPC ...... *H01L 21/3081* (2013.01); *H01L 21/3086* (2013.01); *H01L 21/30604* (2013.01);
(Continued)

(58) Field of Classification Search
CPC .......... H01L 29/6656; H01L 29/66795; H01L 21/3081; H01L 21/3086; H01L 21/30604; H01L 21/31155; H01L 21/823431
See application file for complete search history.

(56) References Cited

U.S. PATENT DOCUMENTS 9,685,440 B1 * 6/2017 Cheng ................. H01L 27/0886
2014/0248778 A1 9/2014 Moll et al.
(Continued)

*Primary Examiner* — Bilkis Jahan
*Assistant Examiner* — Victor V Barzykin
(74) *Attorney, Agent, or Firm* — Jones Day

(57) ABSTRACT

A method of manufacturing a semiconductor device includes depositing a first material on a substrate, depositing on the substrate a second material that has an etch selectivity different from an etch selectively of the first material, depositing a spacer material on the first and second material, and etching the substrate using the spacer material as an etch mask to form a fin under the first material and a fin under the second material.

20 Claims, 14 Drawing Sheets

Related U.S. Application Data

(60) Provisional application No. 62/426,684, filed on Nov. 28, 2016.

(51) Int. Cl.
*H01L 21/8234* (2006.01)
*H01L 29/66* (2006.01)

(52) U.S. Cl.
CPC .. *H01L 21/823431* (2013.01); *H01L 29/6656* (2013.01); *H01L 29/66795* (2013.01)

(56) References Cited

U.S. PATENT DOCUMENTS

| | | |
|---|---|---|
| 2014/0329388 A1 | 11/2014 | Jang et al. |
| 2016/0056269 A1 | 2/2016 | Lee et al. |
| 2017/0179274 A1 | 6/2017 | Karve et al. |

\* cited by examiner

HIGH-DENSITY SEMICONDUCTOR DEVICE

CROSS-REFERENCE TO RELATED APPLICATIONS

This application is a continuation application of U.S. patent Ser. No. 15/585,289, filed May 3, 2017, entitled "High-Density Semiconductor Device," which claims priority to U.S. Provisional Application No. 62/426,684, filed Nov. 28, 2016, entitled "Semiconductor Device." The contents of all of these applications are incorporated herein by reference in their entirety.

BACKGROUND

Manufacturing a semiconductor device includes etching a substrate to form a plurality of fins, removing dummy ones of the fins, thereby leaving some of the fins, i.e., active fins, and fabricating a transistor that includes one or more of the active fins.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
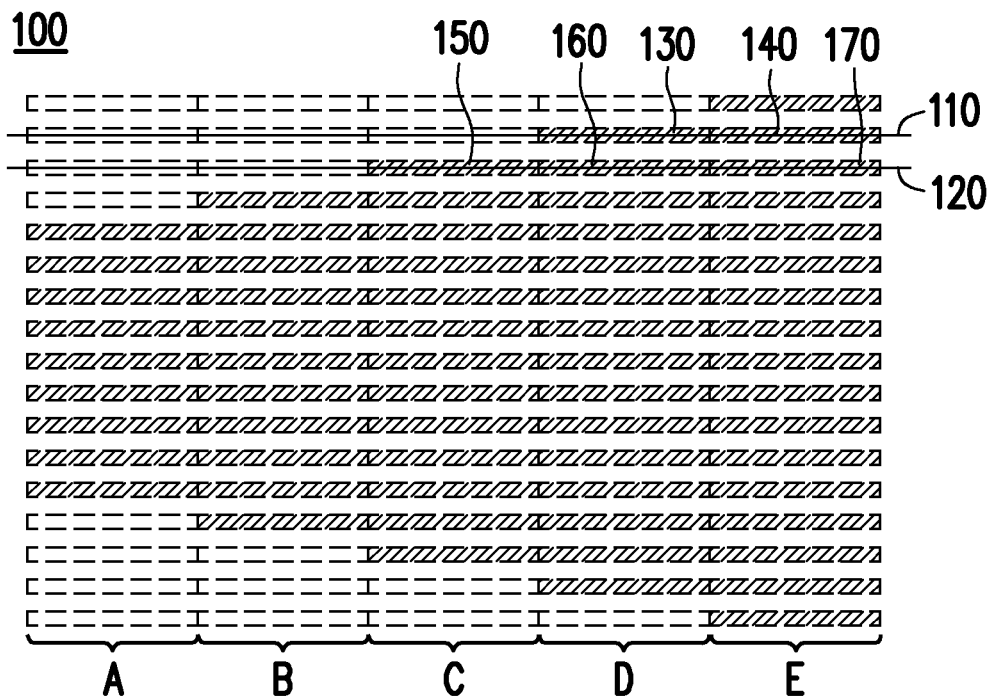
FIG. 1A is a schematic top view illustrating an exemplary semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of manufacturing a semiconductor device includes: forming a mandrel above a substrate; depositing a first spacer material on opposite sidewalls of the mandrel; removing the mandrel, thereby leaving first spacers; depositing a second spacer material on opposite sidewalls of each of the first spacers; removing the first spacers, thereby leaving second spacers; depositing a third spacer material on opposite sidewalls of each of the second spacers; removing the second spacers, thereby leaving third spacers; etching the substrate using the third spacers as an etch mask to form fins; covering some of the fins, i.e., active fins, with a protective layer; removing fins not covered by the protective layer, i.e., dummy fins, thereby leaving the active fins; removing the third spacers; and fabricating a transistor that includes one or more of the active fins. However, such a method can be expensive due to operations associated with the formations of the first, second, and third spacers. Further, the protective layer may undesirably cover a portion of a dummy fin adjacent an active fin. This results in incomplete removal of the dummy fin. To avoid such a result, the fins are spaced apart far enough from each other. This, however, reduces a fin density of the semiconductor device.

The present disclosure provides an exemplary method of manufacturing a semiconductor device. The method fabricates fins in one or more cells, e.g., standard cells, of the semiconductor device. As will be described in detail below, the method limits operations associated with formations of spacers, thereby reducing manufacturing costs of the semiconductor device. Further, the method forms fins under first and second materials alternately arranged along the length of a substrate, whereby a high density of fins is achieved for the semiconductor device.

FIG. 1A is a schematic top view of an exemplary semiconductor device 100 in accordance with some embodiments. The semiconductor device 100 includes a substrate and a row of cells, e.g., cells (A-E). A cell is configured to perform a cell function, e.g., a Boolean logic function, and includes a NOT gate, an AND gate, a NAND gate, an OR gate, a NOR gate, an XOR gate, an XNOR gate, another logic gate, or a combination thereof. It should be understood that the semiconductor device 100 may include any number of cell rows.

Each of the cells (A-E) is disposed above the substrate and includes one or more fins. As illustrated in FIG. 1A, a fin 130 of the cell (D) and a fin 140 of the cell (E) are collinear, i.e., lie on an imaginary straight line 110. As described below, the fins 130, 140 may be fabricated under a first material. A fin 150 of the cell (C), a fin 160 of the cell (D), and a fin 170 of cell (E) lie on an imaginary straight line 120 parallel to the imaginary straight line 110. As described below, the fins 150, 160, 170 may be fabricated under a second material different from the first material.

Figure 1B:
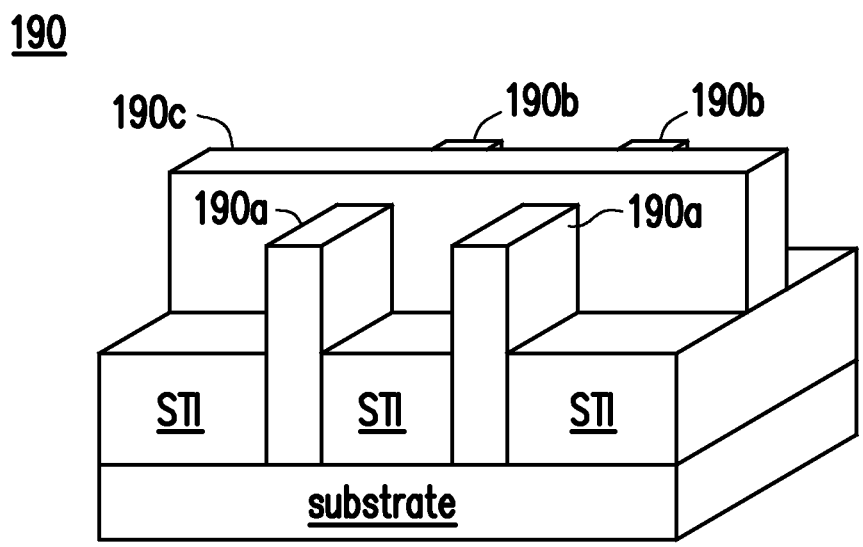
FIG. 1B is a schematic three-dimensional (3D) view of a FinFET of the semiconductor device in accordance with some embodiments.

FIG. 1B is a schematic 3D view of an exemplary transistor 190 of the semiconductor device 100 in accordance with some embodiments. Each of the cells (A-E) further includes a transistor, e.g., transistor 190, that has one or more fins thereof. It should be understood that a cell may include any number of transistors. As illustrated in FIG. 1B, the transistor 190 is a fin field-effect transistor (FinFET) and includes a source region 190a at an end portion of a fin thereof, a drain region 190b at another end portion of the fin, a channel region (not shown) at an intermediate portion of the fin, and a gate region 190c that surrounds the channel region. The semiconductor device 100 further includes an isolation feature, e.g., a shallow trench isolation (STI), that is above the substrate and that surrounds the fin.

Figure 2:
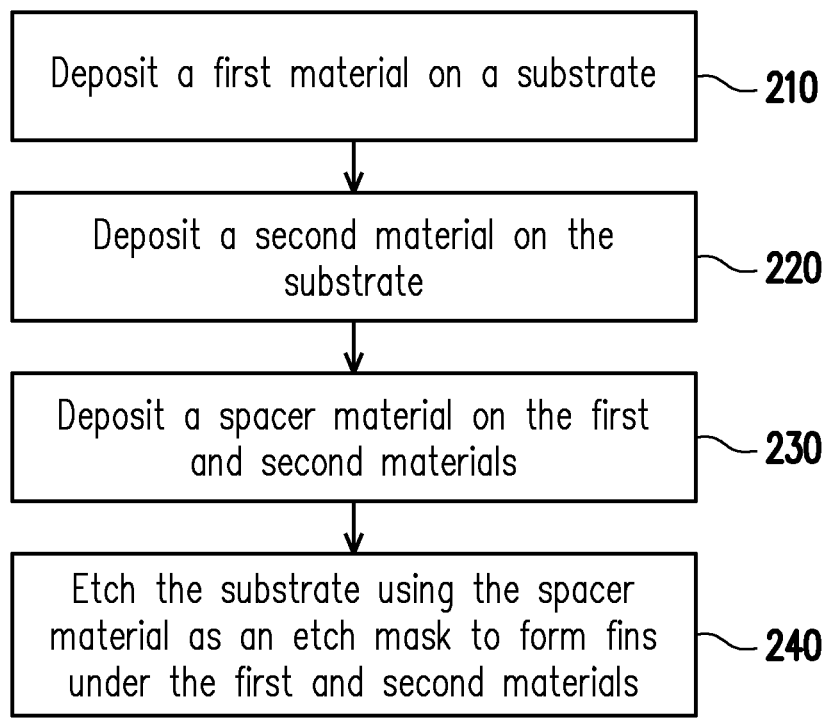
FIG. 2 is a flow chart illustrating an exemplary method of manufacturing a semiconductor device in accordance with some embodiments.
Figure 13:
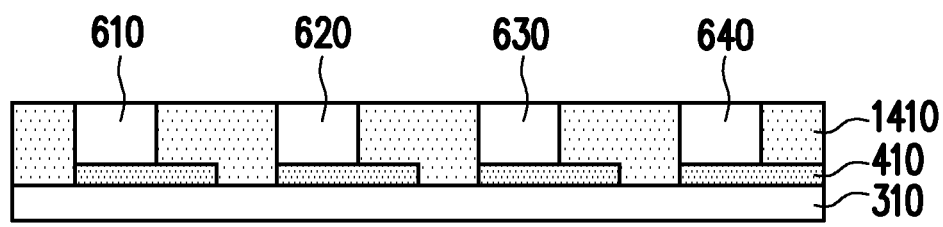

FIG. 2 is a flow chart illustrating an exemplary method 200 of manufacturing a semiconductor device, e.g., the semiconductor device 100 of FIG. 1A, in accordance with some embodiments. In operation 210, a first material, e.g., as described in further detail below in FIG. 4 at 410, is deposited on a substrate. In operation 220, a second material, e.g., as described in further detail below in FIG. 13 at 1410, is deposited on the substrate. In this embodiment, the second material has an etch selectivity different from an etch selectivity of the first material. In operation 230, a spacer material, e.g. as described in further detail below in FIG. 15 at 1510, is deposited on the first and second materials. In operation 240, the substrate is etched using the spacer material as an etch mask to form a fin under the first material, e.g., the fin 1710 under the material 410 in FIG. 17, and a fin under the second material, e.g., the fin 1720 under the material 1410 in FIG. 17.

FIGS. 3-23 are schematic sectional views of a semiconductor device, e.g., the semiconductor device 100 of FIG. 1A, at various stages of manufacturing in accordance with some embodiments, e.g., as produced using operations described above with reference to FIG. 2.

Figure 3:
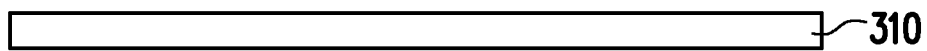
FIGS. 3-23 are schematic sectional views of an exemplary semiconductor device at various stages of manufacturing in accordance with some embodiments.

FIG. 3 illustrates an exemplary structure of the semiconductor device resulting after a substrate 310 is provided/received. Examples of materials for the substrate 310 include, but are not limited to: Si, Ge, GaAs, GaN, GaP, SiC, InAs, InP, any suitable semiconductor material, and a combination thereof. The substrate 310 may be a bulk substrate, a semiconductor-on-insulator (SOI) substrate, or a combination thereof.

Figure 4:
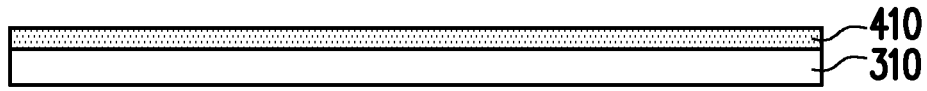
Figure 5:
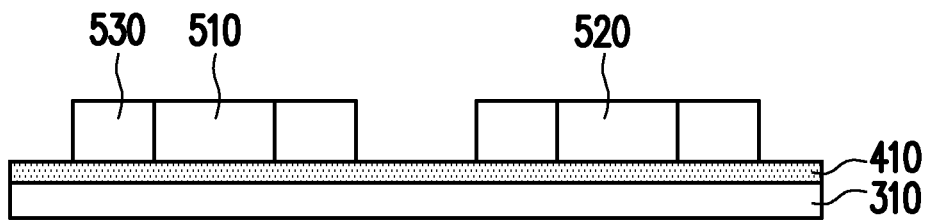

FIG. 4 illustrates an exemplary structure of the semiconductor device resulting after performance of a first material depositing operation, e.g., operation 210 of method 200, and depicts a material 410 deposited on the substrate 310. Operation 210 is performed using a deposition process, such as a chemical vapor deposition (CVD), an atomic layer deposition (ALD), a physical vapor deposition (PVD), or the like. Examples of materials 410 include, but are not limited to: nitride, oxide, SiN, and the like.

Figure 6:
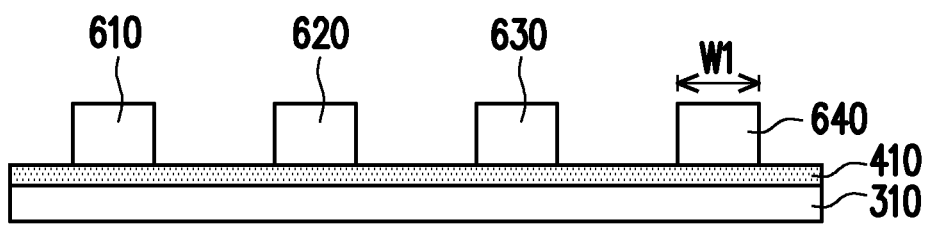

FIG. 6 illustrates an exemplary structure of the semiconductor device resulting after spacers 610, 620, 630, 640 are formed above the material 410. As shown in FIG. 6, each of the spacers 610, 620, 630, 640 has a top surface and opposite first and second sidewalls. In this embodiment, with further reference to FIG. 5, the formation of the spacers 610, 620, 630, 640 above the material 410 includes: forming mandrels 510, 520 above the material 410; depositing, such as by a CVD, an ALD, a PVD, or the like, on opposite sidewalls of each of the mandrels 510, 520 a spacer material 530; and removing the mandrels 510, 520, such as by an etching process, e.g., a dry etch or a wet etch, thereby leaving the spacers 610, 620, 630, 640. For example, each of the spacers 610, 620, 630, 640 has a width (W1) of about 20 nm to about 30 nm.

In this embodiment, the formation of the mandrels 510, 520 includes: forming a sacrificial layer over the material 410; performing a photolithographic process on the sacrificial layer by applying a photoresist over the sacrificial layer, transferring a pattern to the photoresist, and developing the photoresist; performing an etching process, e.g., wet or dry, on the sacrificial layer using the photoresist as an etch mask to form the mandrels 510, 520; and stripping the photoresist.

Figure 7:
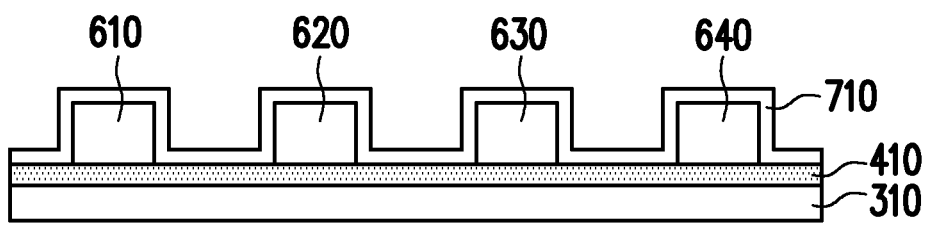

FIG. 7 illustrates an exemplary structure of the semiconductor device resulting after a material 710 is formed on the top surfaces and the first and second sidewalls of the spacers 610, 620, 630, 640. In this embodiment, the material 710 is formed on the top surfaces and the first and second sidewalls of the spacers 610, 620, 630, 640 by depositing, such as by a CVD, an ALD, a PVD, or the like, the material 710 over the structure of FIG. 5 in a conformal manner, i.e., the material 710 on the top surfaces and the first and second sidewalls of the spacers 610, 620, 630, 640 has substantially the same thickness. Examples of materials 710 include, but are not limited to: nitride, oxide, SiN, and the like.

Figure 9:
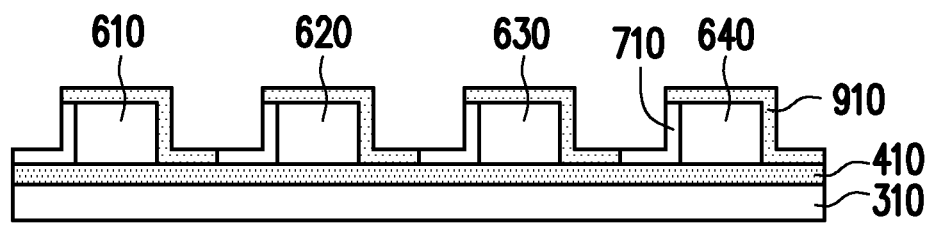

FIG. 9 illustrates an exemplary structure of the semiconductor device resulting after the material 710 on the top surfaces and the second sidewalls of the spacers 610, 620, 630, 640 is converted into a material 910. In this embodiment, the material 910 has an etch selectivity different from an etch selectivity of the material 710.

Figure 8:
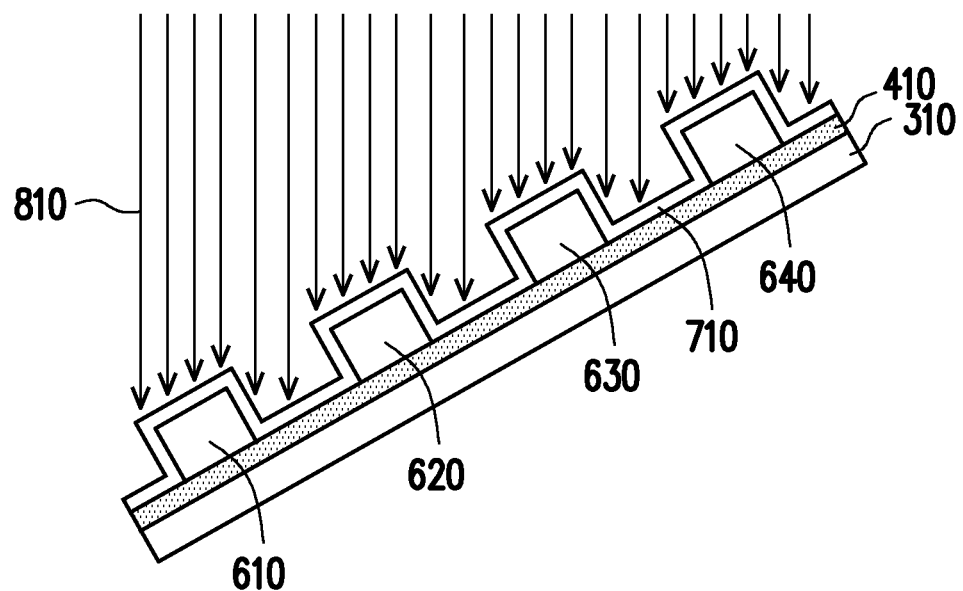

In some embodiments, with further reference to FIG. 8, the conversion of the material 710 on the top surfaces and the second sidewalls of the spacers 610, 620, 630, 640 into the material 910 includes: tilting the structure of FIG. 7 at a tilt angle, e.g., between about 30 degrees and about 60 degrees relative to a horizontal axis; and implanting ions 810, e.g., boron or other suitable ion material, in the material 710 on the top surfaces and second sidewalls of the spacers 610, 620, 630, 640, thereby resulting in the structure of FIG. 9. In other embodiments, the conversion of the material 710 on the top surfaces and the second sidewalls of the spacers 610, 620, 630, 640 into the material 910 may be performed using any technique so long as the material 710 on the top surfaces and the second sidewalls of the spacers 610, 620, 630, 640 is converted into a material that has an etch selectively different from an etch selectivity of the material 710.

Figure 10:
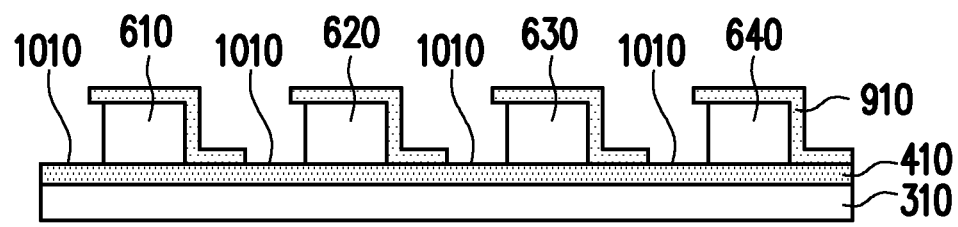
Figure 11:
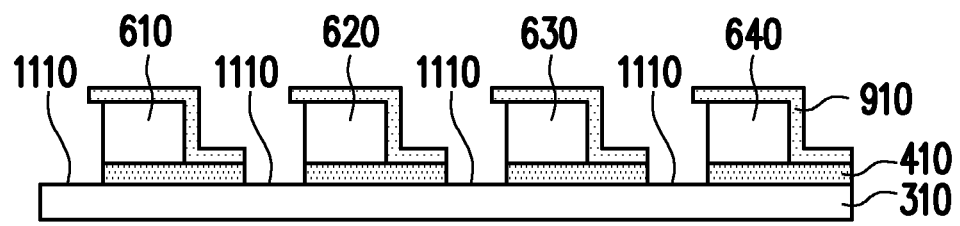
Figure 12:
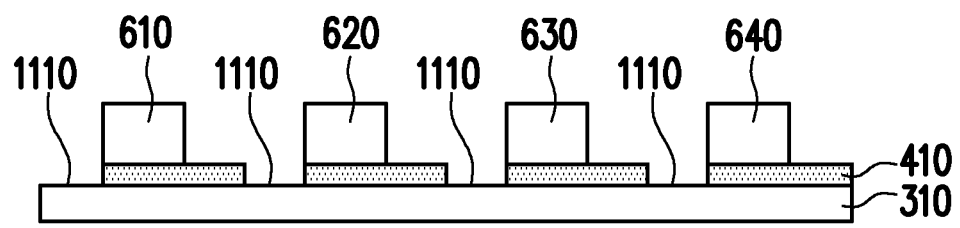

FIG. 10 illustrates an exemplary structure of the semiconductor device resulting after the material 710 are dry or wet etched, exposing portions 1010 of the material 410. FIG. 11 illustrates an exemplary structure of the semiconductor device resulting after the exposed portions 1010 of the material 410 are removed, such as by a dry or wet etch process, exposing portions 1110 of the substrate 310. FIG. 12 illustrates an exemplary structure of the semiconductor device resulting after the material 910 is removed, e.g., is dry or wet etched.

Figure 14:
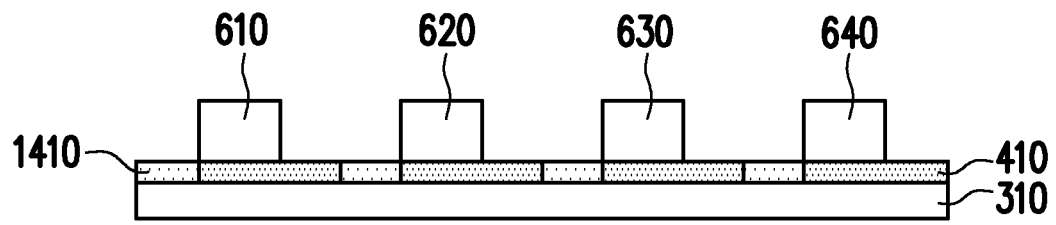

FIG. 14 illustrates an exemplary structure of the semiconductor device resulting after performance of a second material depositing operation, e.g., operation 220 of method 200, and depicts a material 1410 formed on the exposed portions 1110 of the substrate 310. In this embodiment, with further reference to FIG. 13, the formation of the material 1410 on the exposed portions 1110 of the substrate 310 includes: depositing, such by a CVD, an ALD, a PVD, or the like, the material 1410 over the structure of FIG. 12; performing a chemical mechanical planarizing (CMP) process on the material 1410, thereby removing excess material 1410, i.e., the material 1410 on the top surfaces of the spacers 610, 620, 630, 640; and etching back the material 1410 to a height of the material 410, thereby resulting in the structure of FIG. 14. In this embodiment, the material 1410 has an etch selectivity different from an etch selectivity of the material 410. Examples of materials 1410 include, but are not limited to: nitride, oxide, SiN, and the like.

Figure 15:
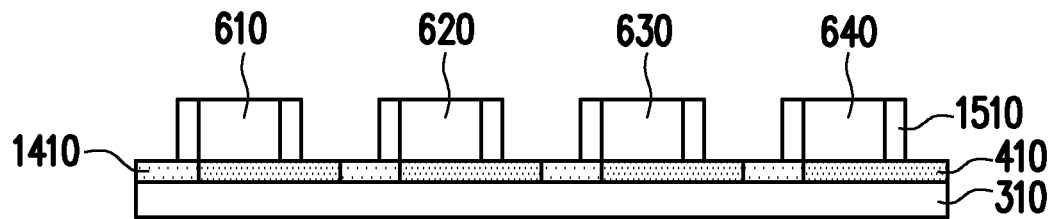
Figure 16:
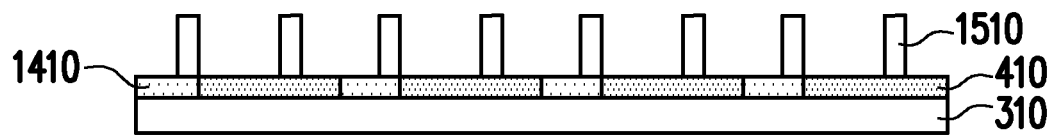
Figure 17:
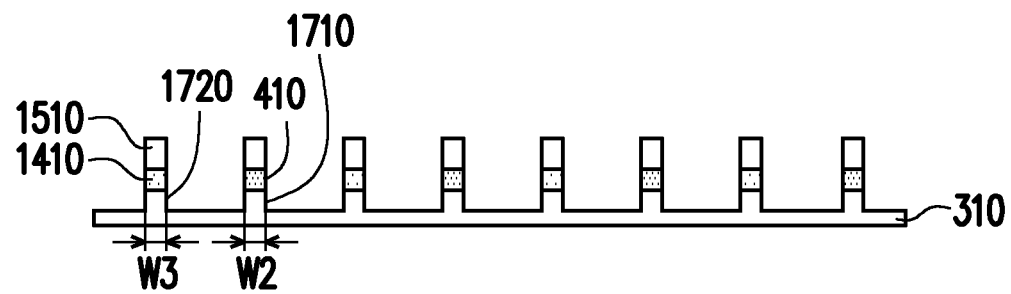

FIG. 15 illustrates an exemplary structure of the semiconductor device resulting after performance of a spacer material depositing operation, e.g., operation 230 of method 200, and depicts a spacer material 1510 deposited, such as by a CVD, an ALD, a PVD, or the like, on the first and second sidewalls of the spacers 610, 620, 630, 640 and the materials 410, 1410. FIG. 16 illustrates an exemplary structure of the semiconductor device resulting after the spacers 610, 620, 630, 640 are removed, such as by a dry or wet etch process. FIG. 17 illustrates an exemplary structure of the semiconductor device resulting after performance of an etching operation, e.g., operation 240 of method 200, and depicts fins under the materials 410, 1410. For clarity of illustration, only one of the fins under the material 410 is labeled as 1710 and only one of the fins under the material 1410 is labeled as 1720 in FIG. 17. As shown in FIG. 17, the fins 1710 under the material 410 and the fins 1720 under the material 1410 are alternately arranged along the length of the substrate 310. In one embodiment, the fins 1710 have a width (W2), e.g., about 4 nm to about 7 nm, different from a width (W3), e.g., about 4 nm to about 7 nm, of the fins 1720. In such one embodiment, the difference between the widths (W2, W3) is about 0.5 nm.

Figure 18:
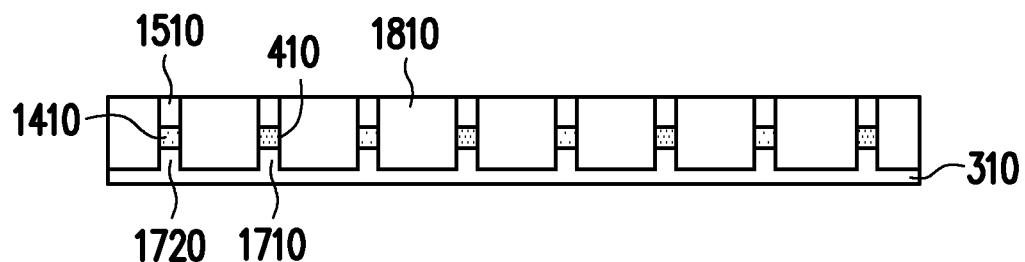
Figure 19:
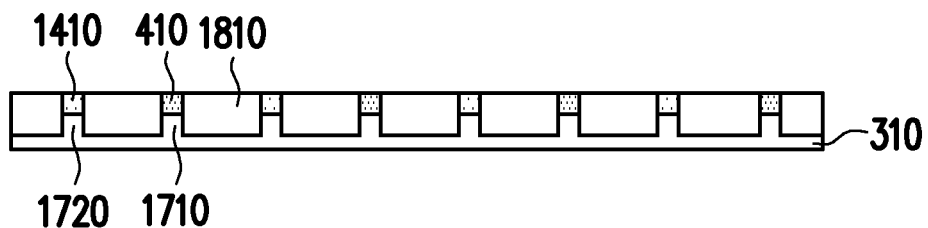
Figure 20:
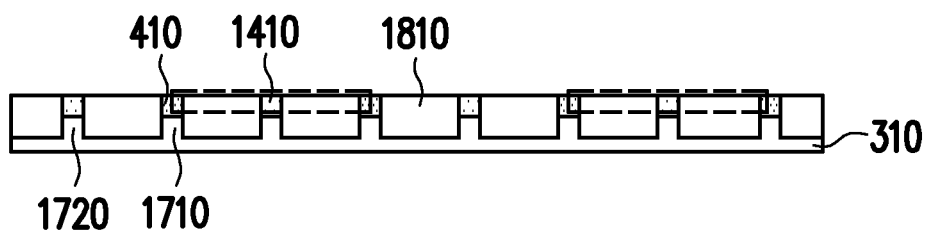
Figure 21:
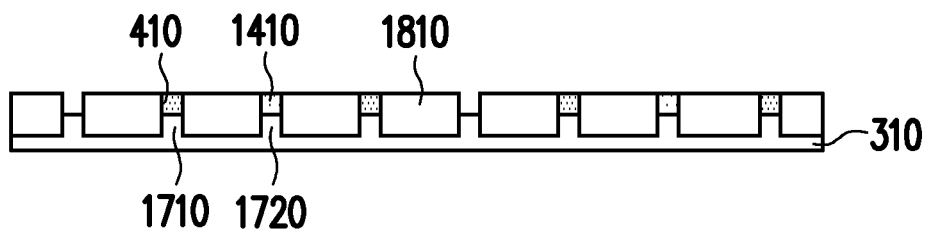

FIG. 18 illustrates an exemplary structure of the semiconductor device resulting after a STI material 1810, e.g., $SiO_2$, is formed over the structure of FIG. 17 and a first CMP process is performed on the STI material 1810, removing excess STI material, i.e., the STI material 1810 on top surfaces of the spacer material 1510. FIG. 19 illustrates an exemplary structure of the semiconductor device resulting after a second CMP process is performed removing the spacer material 1510. FIG. 20 illustrates an exemplary structure of the semiconductor device resulting after some of the fins 1720, i.e., active fins, under the material 1410 are covered with a first protective layer (indicated by dash lines), such as a hard mask layer. FIG. 21 illustrates an exemplary structure of the semiconductor device resulting after the material 1410 not covered by the first protective layer is dry or wet etched, exposing the fins thereunder, i.e., dummy fins, and the first protective layer is stripped.

Figure 22:
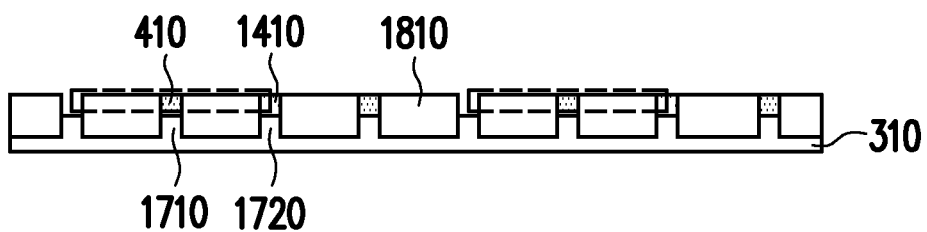
Figure 23:
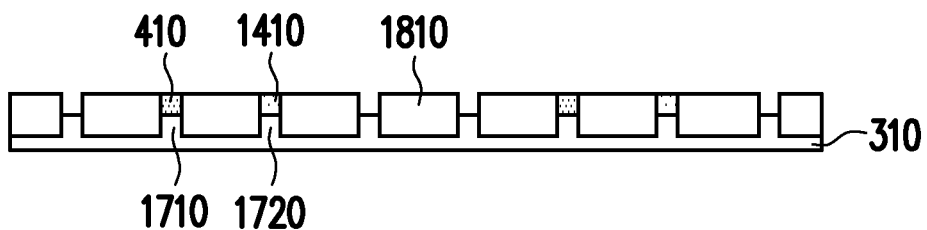

FIG. 22 illustrates an exemplary structure of the semiconductor device resulting after some of the fins 1710, i.e., another active fins, under the material 410 are covered with a second protective layer (indicated by dash lines), such as a hard mask layer. FIG. 23 illustrates an exemplary structure of the semiconductor device resulting after the material 410 not covered by the second protective layer is dry or wet etched, exposing the fins thereunder, i.e., another dummy fins, and the second protective layer is stripped. In a subsequent operation, the dummy fins are removed, e.g., by an etching process. Next, the materials 410, 1410 above the active fins are etched, wet or dry, exposing the active fins thereunder. Thereafter, a transistor, e.g., transistor 190 of FIG. 1B, is fabricated that includes one or more of the active fins.

Although the above-described operations are applied in the fabrication of fins in a cell of a semiconductor device, fins in two or more cells of a semiconductor device may be simultaneously fabricated using such operations.

Figure 24:
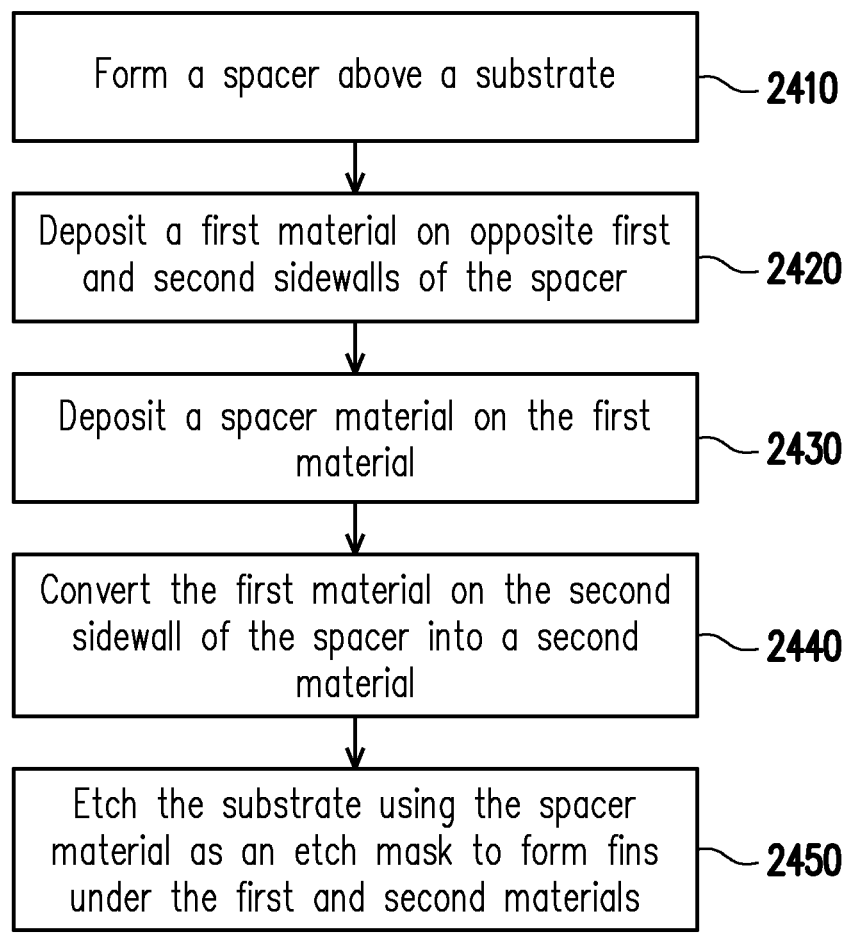
FIG. 24 is a flow chart illustrating another exemplary method of manufacturing a semiconductor device in accordance with some embodiments.
Figure 26:
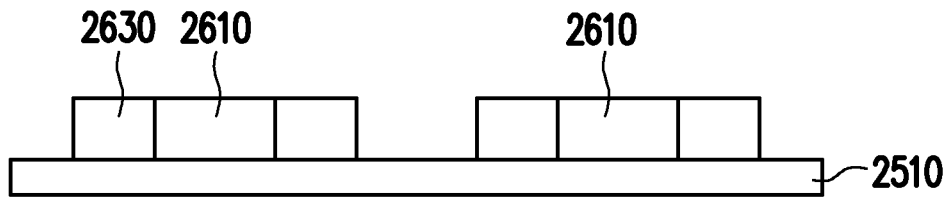
Figure 28:
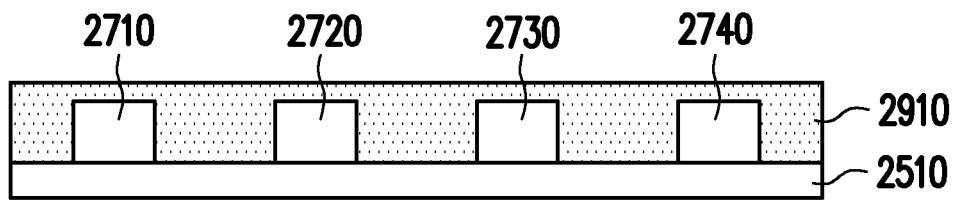

FIG. 24 is a flow chart illustrating another exemplary method 2400 of manufacturing a semiconductor device, e.g., the semiconductor device 100 of FIG. 1A, in accordance with some embodiments. In operation 2410, a spacer, e.g., as described in further detail below in FIG. 26 at 2710, is formed above a substrate. In this embodiment, the spacer has opposite first and second sidewalls. In operation 2420, a first material, e.g. as described in further detail below in FIG. 28 at 2910, is deposited on the first and second sidewalls of the spacer. In operation 2430, a spacer material, e.g., as described in further detail below in FIG. 30 at 3010, is deposited on the first material. In operation 2440, the first material on the second sidewall of the spacer is converted into a second material, e.g., as described in further detail below in FIG. 32 at 3310. In this embodiment, the second material has an etch selectivity different from an etch selectivity of the first material. In operation 2450, the substrate is etched using the spacer material as an etch mask to form a fin under the first material, e.g., the fin 3410 under the material 2910 in FIG. 34, and a fin under the second material, e.g., the fin 3420 under the material 3310 in FIG. 34.

FIGS. 25-40 are schematic sectional views of a semiconductor device, e.g., the semiconductor device 100 of FIG. 1A, at various stages of manufacturing in accordance with some embodiments, e.g., as produced using steps described above with reference to FIG. 24.

Figure 25:
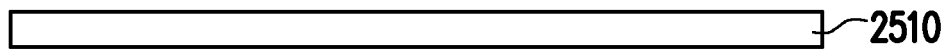
FIGS. 25-40 are schematic sectional views of another exemplary semiconductor device at various stages of manufacturing in accordance with some embodiments.

FIG. 25 illustrates an exemplary structure of the semiconductor device resulting after a substrate 2510 is provided/received. Examples of materials for the substrate 2510 include, but are not limited to: Si, Ge, GaAs, GaN, GaP, SiC, InAs, InP, any suitable semiconductor material, and a combination thereof. The substrate 2510 may be a bulk substrate, an SOI substrate, or a combination thereof.

Figure 27:
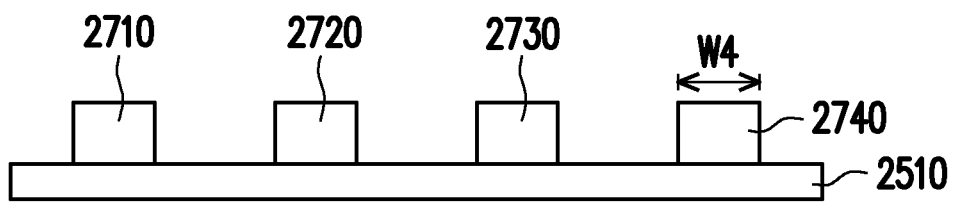

FIG. 27 illustrates an exemplary structure of the semiconductor device resulting after performance of a spacer forming operation, e.g., operation 2410 of method 2400 in FIG. 24, and depicts spacers 2710, 2720, 2730, 2740 above the substrate 2510. As shown in FIG. 27, each of the spacers 2710, 2720, 2730, 2740 has a top surface and opposite first and second sidewalls. In this embodiment, with further reference to FIG. 26, the formation of the spacers 2710, 2720, 2730, 2740 above the substrate 2510 includes: forming mandrels 2610, 2620 above the substrate 2510; depositing, such as by a CVD, an ALD, a PVD, or the like, on opposite sidewalls of each of the mandrels 2610, 2620 a spacer material 2630; and removing the mandrels 2610, 2620, such as by an etching process, e.g., a dry or wet etch, thereby leaving the spacers 2710, 2720, 2730, 2740. For example, each of the spacers 2710, 2720, 2730, 2740 has a width (W4) of about 20 nm to about 30 nm.

In this embodiment, the formation of the mandrels 2610, 2620 includes: forming a sacrificial layer over the substrate 2510; performing a photolithographic process on the sacrificial layer by applying a photoresist over the sacrificial layer, transferring a pattern to the photoresist, and developing the photoresist; performing an etching process, e.g., wet or dry, on the sacrificial layer using the photoresist as an etch mask to form the mandrels 2610, 2620; and stripping the photoresist.

Figure 29:
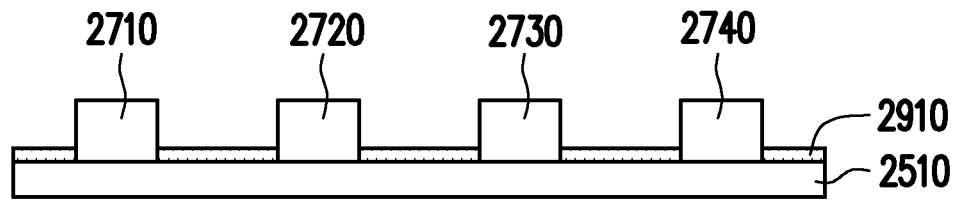

FIG. 29 illustrates an exemplary structure of the semiconductor device resulting after performance of a first material depositing operation, e.g., operation 2420 of method 2400, and depicts a material 2910 deposited on the first and second sidewalls of the spacers 2710, 2720, 2730, 2740. In this embodiment, with further reference to FIG. 28, the formation of the material 2910 on the first and second sidewalls of the spacers 2710, 2720, 2730, 2740 includes: forming the material 2910 over the structure of FIG. 26; performing a CMP process on the material 2910, thereby removing excess material 2910, i.e., the material 2910 on the top surfaces of the spacers 2710, 2720, 2730, 2740; and etching back the material 2910 to a height lower than a height of the spacers 2710, 2720, 2730, 2740, thereby resulting in the structure of FIG. 29. Examples of materials 2910 include, but are not limited to: nitride, oxide, SiN, and the like.

Figure 30:
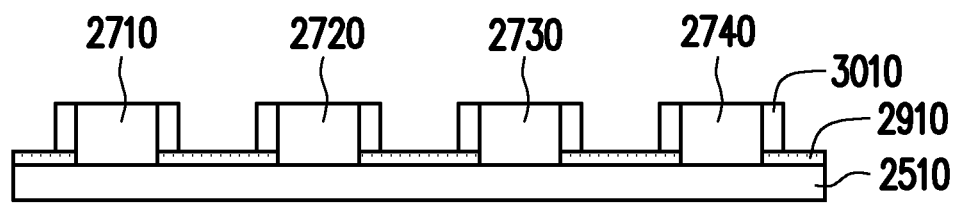
Figure 31:
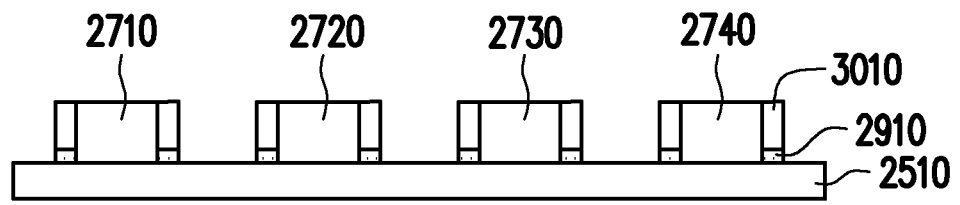

FIG. 30 illustrates an exemplary structure of the semiconductor device resulting after performance of a spacer material depositing operation, e.g., operation 2430 of method 2400, and depicts a spacer material 3010 deposited, such as by a CVD, an ALD, a PVD, or the like, on the first and second sidewalls of the spacers 2710, 2720, 2730, 2740 and the material 2910. FIG. 31 illustrates an exemplary structure of the semiconductor device resulting after the material 2910 on portions of the substrate 2510 is removed, such as by an etching process, wet or dry.

Figure 33:
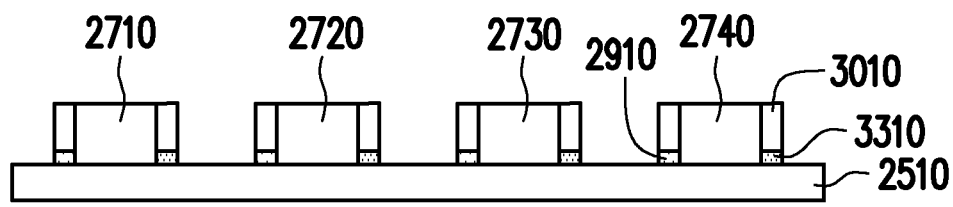

FIG. 33 illustrates an exemplary structure of the semiconductor device resulting after performance of a material converting operation, e.g., operation 2440 of method 2400, and depicts the material 2910 on the second sidewalls of the spacers 2710, 2720, 2730, 2740 is converted into a material 3310. In this embodiment, the material 3310 has an etch selectivity different from an etch selectivity of the material 2910.

Figure 32:
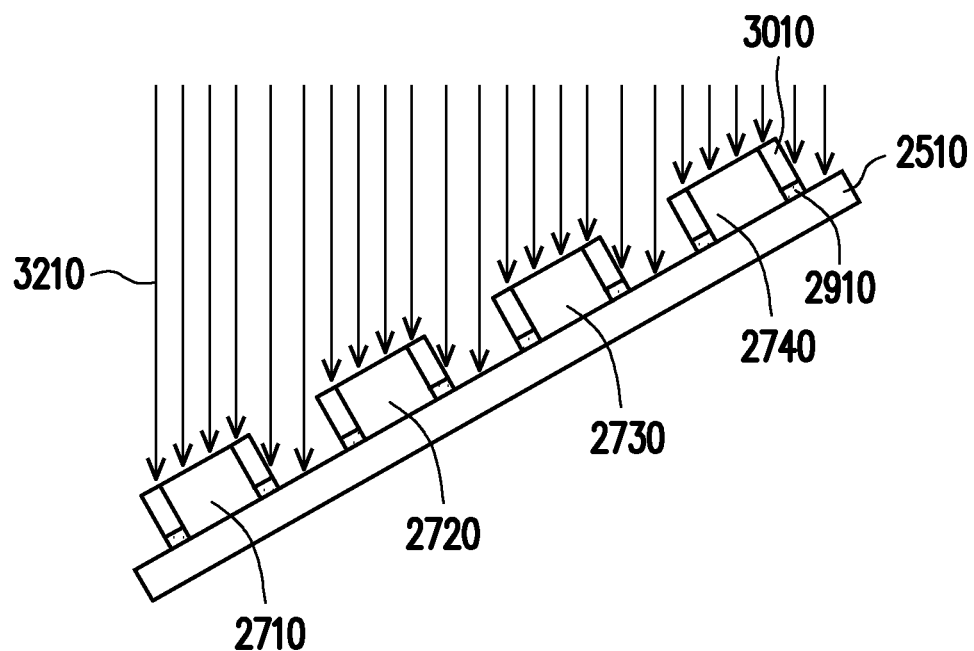

In some embodiments, with further reference to FIG. 32, the conversion of the material 2910 on the second sidewalls of the spacers 2710, 2720, 2730, 2740 into the material 3310 includes: tilting the structure of FIG. 31 at a tilt angle, e.g., between about 30 degrees and about 60 degrees relative to a horizontal axis; and implanting ions 3310, e.g., boron or other suitable ion material, in the material 2910 on the second sidewalls of the spacers 2710, 2720, 2730, 2740, thereby resulting in the structure of FIG. 33. In other embodiments, the conversion of the material 2910 on the second sidewalls of the spacers 2710, 2720, 2730, 2740 into the material 3310 may be performed using any technique so long as the material 2910 on the second sidewalls of the spacers 2710, 2720, 2730, 2740 is converted into a material that has an etch selectively different from an etch selectivity of the material 2910.

Figure 34:
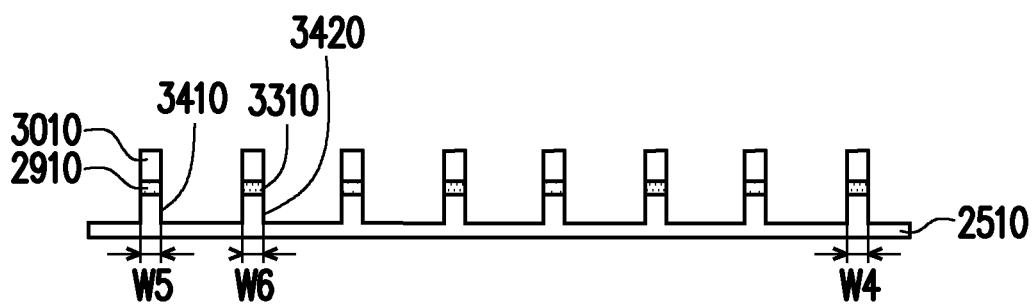

FIG. 34 illustrates an exemplary structure of the semiconductor device resulting after the spacers 2710, 2720, 2730, 2740 are removed, such as by a dry or wet etch process and after performance of an etching operation, e.g., operation 2450 of method 2400, and depicts fins under the materials 2910, 3310. For clarity of illustration, only one of the fins under the material 2910 is labeled as 3410 and only one of the fins under the material 3310 is labeled as 3420 in FIG. 34. As shown in FIG. 34, the fins 3410 under the material 2910 and the fins 3420 under the material 3310 are alternately arranged along the length of the substrate 2510. In one embodiment, the fins 3410 have a width (W5), e.g., about 4 nm to about 7 nm, different from a width (W6), e.g., about 4 nm to about 7 nm, of the fins 3420. In such one embodiment, the difference between the widths (W5, W6) is about 0.5 nm.

Figure 35:
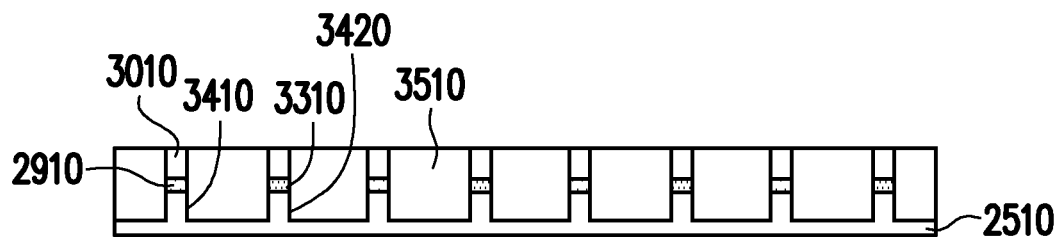
Figure 36:
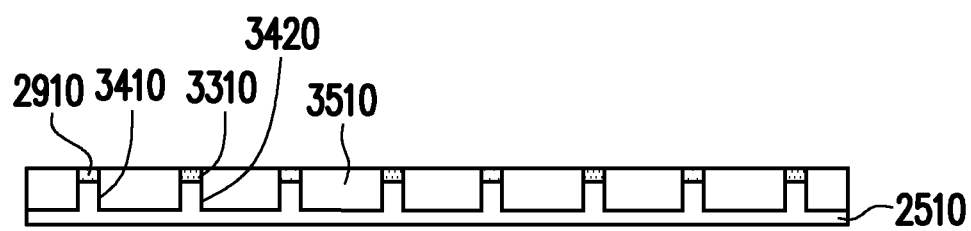
Figure 37:
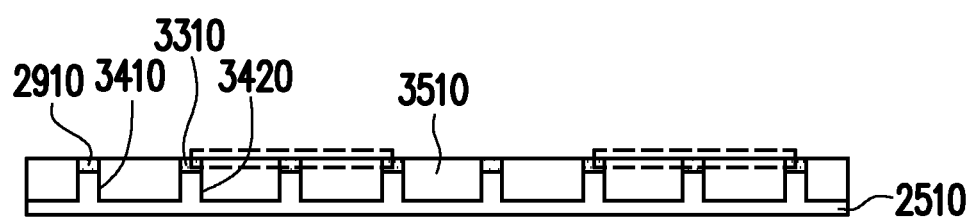
Figure 38:
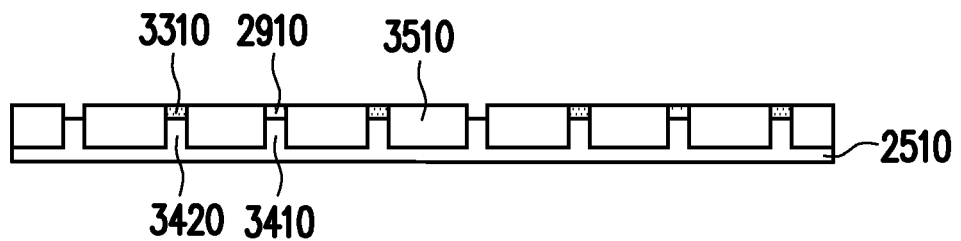

FIG. 35 illustrates an exemplary structure of the semiconductor device resulting after an STI material 3510, e.g., $SiO_2$, is formed over the structure of FIG. 34 and a first CMP process is performed on the STI material 3510, removing excess STI material, i.e., the STI material 3510 on top surfaces of the spacer material 3010. FIG. 36 illustrates an exemplary structure of the semiconductor device resulting after a second CMP process is performed removing the spacer material 3010. FIG. 37 illustrates an exemplary structure of the semiconductor device resulting after some of the fins 3410, i.e., active fins, under the material 2910 are covered with a first protective layer (indicated by dash lines), such as a hard mask layer. FIG. 38 illustrates an exemplary structure of the semiconductor device resulting after the material 2910 not covered by the first protective layer is dry or wet etched, exposing the fins thereunder, i.e., dummy fins, and the first protective layer is stripped.

Figure 39:
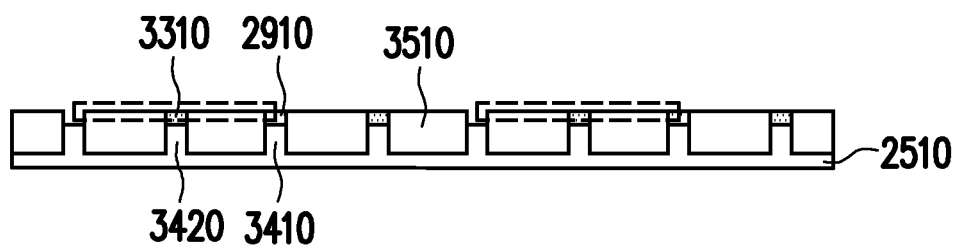
Figure 40:
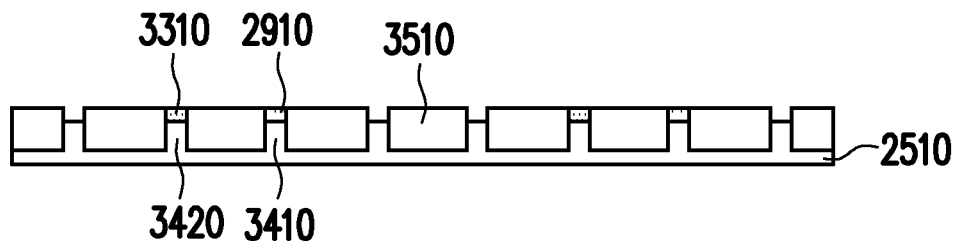

FIG. 39 illustrates an exemplary structure of the semiconductor device resulting after some of the fins 3420, i.e., another active fins, under the material 3310 are covered with a second protective layer (indicated by dash lines), such as a hard mask layer. FIG. 40 illustrates an exemplary structure of the semiconductor device resulting after the material 3310 not covered by the second protective layer is dry or wet etched, exposing the fins thereunder, i.e., another dummy fins, and the second protective layer is stripped. In a subsequent operation, the dummy fins are removed, e.g., by an etching process. Next, the materials 2910, 3310 above the active fins are etched, wet or dry, exposing the active fins thereunder. Thereafter, a transistor, e.g., transistor 190 of FIG. 1B, is fabricated that includes one or more of the active fins.

Although the above-described operations are applied in the fabrication of fins in a cell of a semiconductor device, fins in two or more cells of a semiconductor device may be simultaneously fabricated using such operations.

It has thus been shown that the method of manufacturing a semiconductor device of the present disclosure limits operations associated with the formations of spacers, e.g., operations described above with respect to FIGS. 5 and 15 in an embodiment of the present disclosure or operations described above with respect to FIGS. 26 and 30 in another embodiment of the present disclosure, thereby reducing manufacturing costs of the semiconductor device, e.g., for about 33% of manufacturing costs of a conventional semiconductor device. Further, the method fabricates fins under first and second materials that are arranged alternately and that have different etch selectivity, e.g., materials 410, 1410 in FIG. 17 or materials 2910, 3310 in FIG. 34. This permits the fins to be spatially close to each other, e.g., pitch between the fins is less than about 24 nm, whereby a high density of fins is achieved for the semiconductor device. This also permits fins fabricated under the first/second materials and in a first cell to be collinear with fins fabricated under the first/second materials and in second cell at the same row as the first cell, even if the first and second cells have different numbers of fins, as illustrated in FIG. 1A.

In one embodiment, a method of manufacturing a semiconductor device comprises depositing a first material on a substrate, depositing on the substrate a second material that has an etch selectivity different from an etch selectively of the first material, forming a spacer material on the first and second materials, and etching the substrate using the spacer material as an etch mask to form a fin under the first material and a fin under the second material.

In another embodiment, a method of manufacturing a semiconductor device comprises forming above a substrate a spacer that has opposite first and second sidewalls, depositing a first material on the first and second sidewalls of the spacer, depositing a spacer material on the first material, converting the first material on the second sidewall of the spacer into a second material that has an etch selectivity different from an etch selectively of the first material, and etching the substrate using the spacer material as an etch mask to form a fin under the first material and a fin under the second material.

In another embodiment, a method comprises providing, above a substrate, first and second materials alternately arranged along the length of the substrate and etching the substrate to form fins under the first and second materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   depositing a first material on a substrate;
   depositing on the substrate a second material;
   depositing a spacer material on the first and second materials;
   forming a third material on a top surface and a sidewall of the spacer; and
   etching the third material on the sidewall of the spacer to expose a portion of the first material.

2. The method of claim 1, wherein the second material has an etch selectivity different from an etch selectivity of the first material.

3. The method of claim 1, further comprising converting the third material on the top surface and the sidewall of the spacer into a fourth material that has an etch selectivity different from an etch selectivity of the third material.

4. The method of claim 3, wherein converting the third material on the top surface and the sidewall of the spacer into the fourth material includes implanting ions in the third material on the top surface and the sidewall of the spacer.

5. The method of claim 3, wherein converting the third material on the top surface and the sidewall of the spacer into the fourth material includes tilting the semiconductor device at a tilt angle.

6. The method of claim 5, wherein the tilt angle is between about 30 degrees and about 60 degrees relative to a horizontal axis.

7. The method of claim 1, further comprising removing the exposed portion of the first material to expose a portion of the substrate.

8. The method of claim 1, further comprising etching back the second material to a height of the first material.

9. The method of claim 1, further comprising etching the substrate using the second spacer material as an etch mask to form a fin under the first material and a fin under the second material.

10. The method of claim 9, wherein etching the substrate includes forming a plurality of the fins under the first material and a plurality of the fins under the second material such that the fins under the first material and the fins under the second material are alternately arranged along the length of the substrate.

11. The method of claim 9, further comprising fabricating a transistor that includes one of the fins.

12. A semiconductor device, the comprising:
   a substrate;
   a first material formed on the substrate;
   a second material formed on the substrate; and
   a plurality of fins formed from the substrate under the first and second materials;
   wherein the first and second materials are formed on the substrate by
   (1) forming above the substrate a spacer that has opposite first and second sidewalls,
   (2) depositing the first material on the first and second sidewalls of the spacer,
   (3) depositing a spacer material on the first material, and
   (4) converting the first material on the second sidewall of the spacer into the second material.

13. The semiconductor device of claim 12, the second material has an etch selectivity different from an etch selectively of the first material.

14. The semiconductor device of claim 12, wherein the plurality of fins are formed by etching the substrate using the spacer material as an etch mask.

15. The semiconductor device of claim 12, wherein the substrate is Si, Ge, GaAs, GaN, GaP, SiC, InAs, InP, or a combination thereof.

16. The semiconductor device of claim 12, wherein the substrate is a semiconductor-on-insulator (SOI) substrate.

17. A method comprising:
   forming above a substrate a spacer that has opposite first and second sidewalls;
   depositing a first material on the first and second sidewalls of the spacer;
   depositing a spacer material on the first material;
   converting the first material on the second sidewall of the spacer into a second material;
   etching the substrate to fabricate fins under the first and second materials; and
   fabricating a transistor that includes one of the fins.

18. The method of claim 17, wherein etching the substrate is such that the fins fabricated under the first materials have a width different from a width of the fins fabricated under the second materials.

19. The method of claim 18, wherein the widths have a difference of about 0.5 nm.

20. The method of claim 17, wherein etching the substrate is such that none of the fins under the first materials in a first cell is collinear with the fins under the second materials and in a second cell at the same row as the first cell.

* * * * *